United States Patent [19]

So et al.

[11] Patent Number: 5,731,661
[45] Date of Patent: Mar. 24, 1998

[54] PASSIVATION OF ELECTROLUMINESCENT ORGANIC DEVICES

[75] Inventors: Franky So, Tempe; Song Q. Shi, Phoenix; Cynthia A. Gorsuch, Glendale, all of Ariz.

[73] Assignee: Motorola, Inc., Schaumburg, Ill.

[21] Appl. No.: 679,881

[22] Filed: Jul. 15, 1996

[51] Int. Cl.[6] ........................................ B32B 7/02
[52] U.S. Cl. ..................... 313/504; 313/503; 313/355; 313/633; 313/631
[58] Field of Search ............................ 313/504, 461, 313/463, 466, 473, 503, 505, 631, 326, 355, 633; 140/71.5

[56] References Cited

U.S. PATENT DOCUMENTS

| | | | |
|---|---|---|---|
| 4,885,211 | 12/1989 | Tang et al. | 313/504 X |
| 5,059,861 | 10/1991 | Littman et al. | 313/504 X |
| 5,073,446 | 12/1991 | Scozzafava et al. | 313/504 X |
| 5,516,577 | 5/1996 | Matsuura et al. | 313/504 X |

*Primary Examiner*—Ashok Patel
*Attorney, Agent, or Firm*—Eugene A. Parsons

[57] ABSTRACT

A passivated organic device including a transparent layer of conductive material formed on a supporting substrate. An active organic media formed on the transparent layer and an electrode formed on the active organic media, the electrode including a thin layer of lithium formed on the active organic media and a layer of indium overlying and passivating the layer of lithium, and completing the electrode.

2 Claims, 1 Drawing Sheet

PASSIVATION OF ELECTROLUMINESCENT ORGANIC DEVICES

FIELD OF THE INVENTION

The present invention pertains to organic devices and more specifically to passivated electroluminescent organic devices and methods of passivation.

BACKGROUND OF THE INVENTION

Electroluminescent organic devices, and especially organic light emitting devices (LEDs) and the like, generally utilize a layer of low work function metal in the cathode to ensure efficient electron injecting electrodes and low operating voltages. However, the use of a low work function metal presents a problem since those metals are so easily oxidized and oxidation of the cathode metal greatly decreases the efficiency of the device. In the prior art, the cathode consists of a low work function metal and another metal which is less reactive. The additional layer of metal improves adhesion to the organic material as well as slowing the oxidation of the lower work function metal. Magnesium based metals, such as MgAg and MgAl have been widely used, as described in U.S. Pat. No. 4,885,211 "entitled Electroluminescent Device With Improved Cathode", issued Dec. 5, 1989 and U.S. Pat. No. 5,059,861, entitled "Organic Electroluminescent Device With Stabilizing Cathode Capping Layer", issued Oct. 22, 1991. Another metal system that has been shown to give high efficiency to a device is lithium, such as LiAg and LiAl. However, it was discovered that all of these metal systems still exhibit significant degradation as indicated by dark spot formation on the devices.

One solution to the metal degradation problem was to deposit yet another additional layer of metal on the cathode to further slow the degradation process. In U.S. Pat. No. 5,073,446, entitled "Organic Electroluminescent Device With Stabilizing Fused Metal Particle Cathode", issued Dec. 17, 1991, fused metal particles of indium are disclosed as the additional layer. Additionally, it has been previously published (J. Kido, K. Nagai, and Y. Okamoto, IEEE Trans. Electron Devices, Vol. 7, pp. 1342–1344, July 1993) that a thin layer of lithium can further improve the efficiency of organic light emitting devices. Because of the use of lithium or a relatively thick layer of Mg alloy as the cathode material in the organic devices, the above mentioned examples require the use of a hermetic seal to prevent oxygen and moisture from degrading the device. A hermetic seal is normally required in prior art devices to achieve long term stability and longevity. Several types of hermetic seals are utilized, the most common of which are inorganic materials, such as metals and the like.

Several types of hermetic seals are utilized, the most common of which are metal cans. However, metal cans are very expensive to fabricate and require extensive labor to assemble. Further, metal cans are large and heavy so that they severely limit the applications of electroluminescent organic devices.

At the present time there exist a need to devise a relatively inexpensive and convenient method of contacting and passivating electroluminescent organic devices.

It is a purpose of the present invention to provide a new and improved top cathode contact for electroluminescent organic device.

It is another purpose of the present invention to provide a new and improved method of passivating electroluminescent organic devices which is relatively convenient and inexpensive to perform.

SUMMARY OF THE INVENTION

Briefly, to achieve the desired objects of the instant invention in accordance with a preferred embodiment thereof, provided is a passivated organic device including a transparent layer of conductive material formed on a supporting substrate. An active organic media formed on the transparent layer and an electrode formed on the active organic media, the electrode including a thin layer of lithium formed on the active organic media and a layer of indium overlying and passivating the layer of lithium, and completing the electrode.

Further provided is a method of forming a passivated organic device including the steps of forming a transparent layer of conductive material on a supporting substrate. Forming an active organic media on the transparent layer and forming an electrode on the active organic media. The electrode is formed by forming a thin layer of lithium on the active organic media and forming a layer of indium overlying and passivating the layer of lithium, and completing the electrode.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENTS

Figure 1:
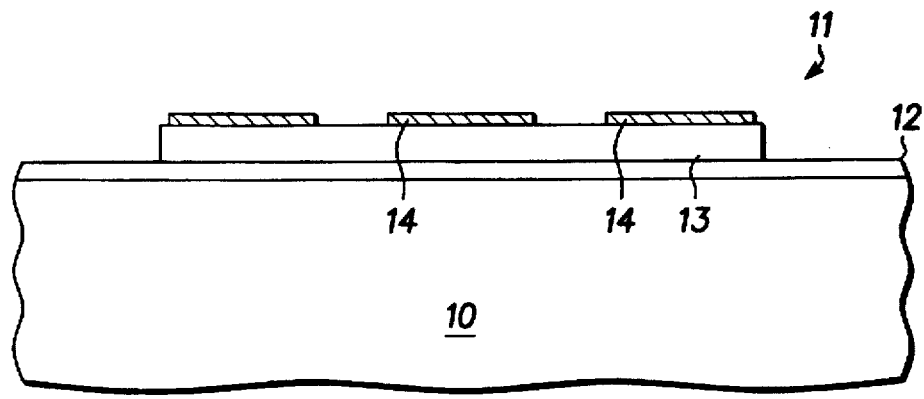
FIGS. 1–2 are simplified cross-sectional views of an organic LED array illustrating the steps in a method of forming a cathode and passivation in accordance with the present invention.
Figure 2:
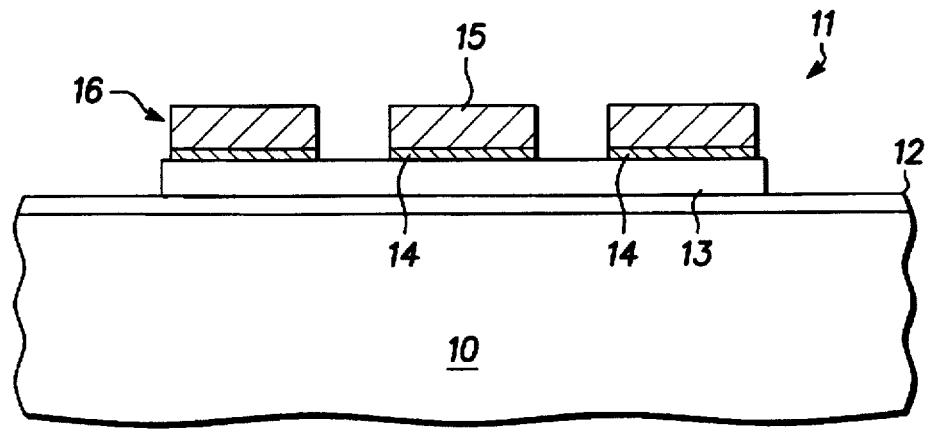

Turning now to the drawings in which like reference characters indicate corresponding elements throughout the several views, attention is first directed to FIGS. 1 and 2 which are simplified cross-sectional views of an organic LED array illustrating several steps in a method of forming a cathode and passivation thereof in accordance with the present invention.

Referring specifically to FIG. 1, a substrate 10 is illustrated which is, in this specific embodiment, some optically clear material, such as glass, quartz, a transparent semiconductor material or the like, etc. An array 11 of pixels of organic light emitting devices (OLEDs) is positioned on substrate 10, generally by fabricating array 11 directly on substrate 10 in any of the various methods of fabricating electroluminescent organic LEDs. As a specific example, array 11 includes transparent strips 12 of conductive material, such as indium-tin-oxide (ITO) or the like, with an active organic media 13, such as electron and/or hole transporting and/or injecting materials, positioned thereon. A thin layer 14 of lithium (Li) is formed on the surface of organic media 13 by any known technique, but preferably by evaporation. Lithium ensures an efficient electron injection and low operating voltages. As previously stated, array 11 of organic LEDs, and especially layer 14 of lithium, is susceptible to oxygen and moisture in the surrounding atmosphere and must, therefore, be passivated to provide reliability and a reasonable longevity.

Referring now to FIG. 2, a layer 15 of Indium (In) is deposited on layer 14 of Li by evaporation, to complete a cathode 16. Layer 15 of In serves as a protective as well as conductive portion of cathode 16.

Figure 3:
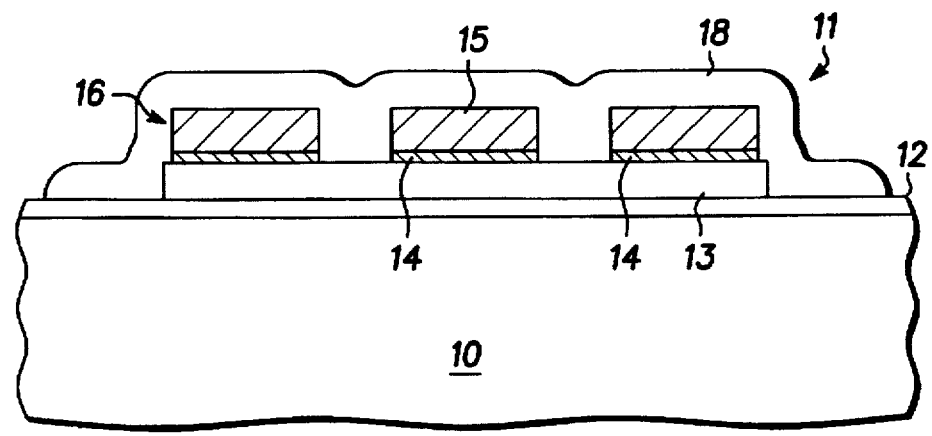
FIG. 3 illustrates the final step in present invention illustrating an epoxy encapsulant sealing the device.

Turning now to FIG. 3, array 11 and cathodes 16 are overcoated with a sealing layer 18. Sealing layer 18 serves as a diffusion barrier to oxygen and moisture. Sealing layer 18 is preferably an epoxy encapsulant or polymer laminated aluminum foil.

Thus, an improved electroluminescent device with an improved cathode that does not require an expensive and complicated hermetic seal has been disclosed. in a specific example, a thin layer of lithium (<100 Å) is applied and capped with a layer of indium. Since the device is passivated with the deposited indium layer, a true hermetic seal is not required, which increases the options available for encapsulation of the organic light emitting device. Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A passivated electrode in an organic device comprising:
   a thin layer of lithium formed on an organic media of the device; and
   a layer of indium formed on the layer of lithium.

2. A passivated electrode as claimed in claim 1 wherein the indium layer is substantially thicker than the lithium layer.

* * * * *